United States Patent
Kimura

[11] Patent Number: 5,999,007
[45] Date of Patent: Dec. 7, 1999

[54] BURN-IN APPARATUS OUTPUTTING A PRECISE, STABLE BURN-IN VOLTAGE

[75] Inventor: Takashi Kimura, Kanagawa-ken, Japan

[73] Assignee: Nissan Motor Co., Ltd., Kanagawa-ken, Japan

[21] Appl. No.: 08/858,540

[22] Filed: May 16, 1997

[30] Foreign Application Priority Data

May 17, 1996 [JP] Japan .................................. 8-123614

[51] Int. Cl.⁶ .................................................. G01R 31/28
[52] U.S. Cl. .................................................. 324/760
[58] Field of Search .................. 324/73.1, 158.1, 324/760, 765, 763; 438/14, 17, 18; 257/40, 48

[56] References Cited

U.S. PATENT DOCUMENTS 5,656,944  8/1997  Choi ........................................ 324/763
5,825,193  10/1998 Nakata et al. ........................... 324/760

FOREIGN PATENT DOCUMENTS 7-287603  10/1995  Japan .

*Primary Examiner*—Vinh P. Nguyen
*Attorney, Agent, or Firm*—McDermott, Will & Emery

[57] ABSTRACT

An external communication circuit transmits a high voltage switching command and a normal voltage switching command via serial communication. A CPU outputs a switching signal when the high voltage switching command is input from the external communication circuit and terminates output of the switching signal when the normal voltage switching command is input from the external communication circuit. A voltage regulator supplies a normal power supply voltage to a semiconductor integrated circuit in an on-board condition when the switching signal is not input from the CPU, and supplies a high power supply voltage which is higher than the normal power supply voltage to the semiconductor integrated circuit.

10 Claims, 8 Drawing Sheets

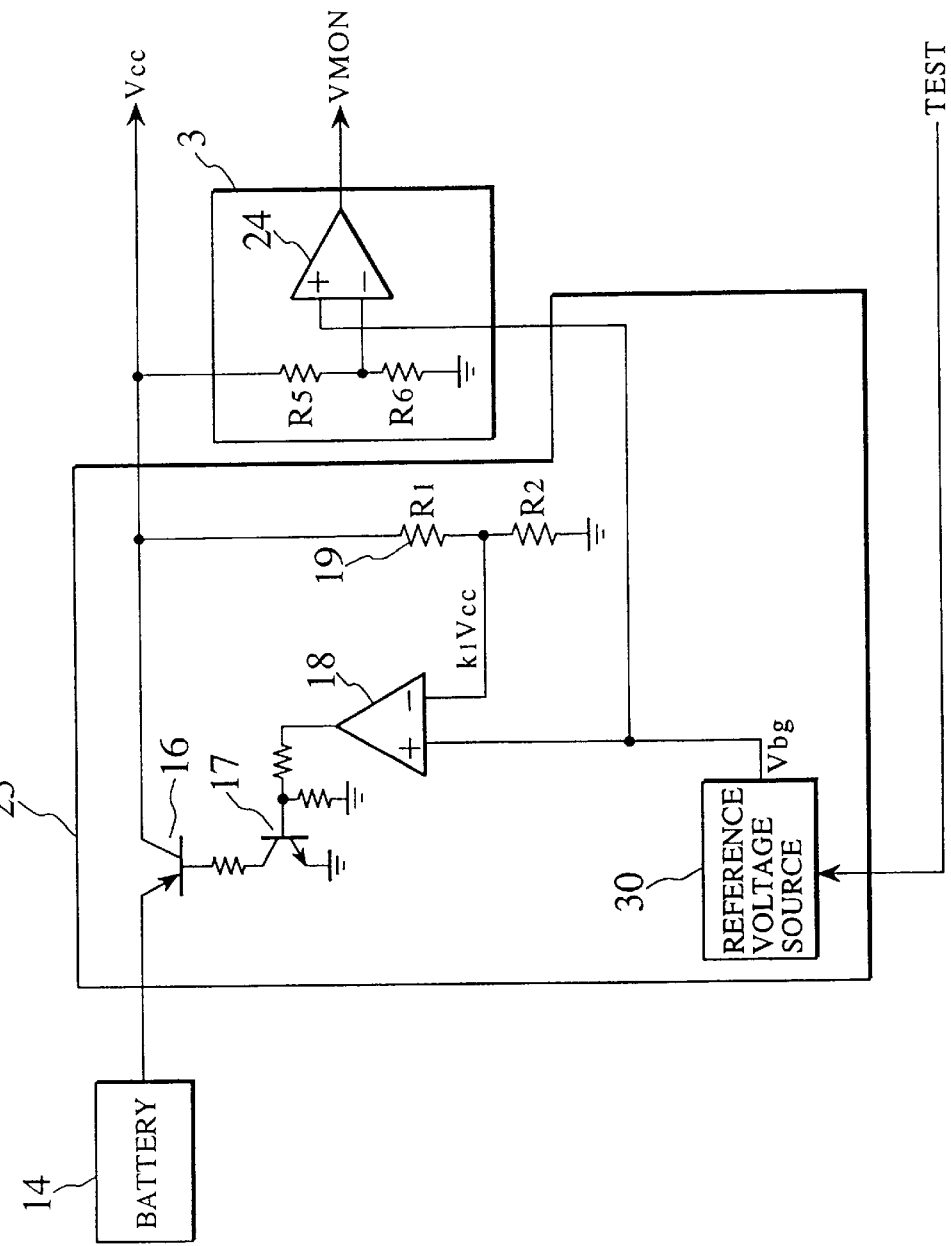

BURN-IN APPARATUS OUTPUTTING A PRECISE, STABLE BURN-IN VOLTAGE

BACKGROUND OF THE INVENTION

1. Field of the Invention

The present invention relates to a burn-in apparatus which can operate a semiconductor integrated circuit including a microcomputer, e.g., an electronic control unit for automobile (referred to as "ECU" hereinafter) in an on-board condition (i.e., a condition where the circuit is mounted on a substrate) at high temperature and high voltage.

2. Description of the Prior Art

Usually a semiconductor integrated circuit such as ECU for automobile is subjected to "screening" so as to remove its early failure. Where "screening" consists of "burn-in" and "test", and the term "burn-in" means to operate the circuit at high temperature and high voltage and the term "test" means to check based on the result of burn-in whether the circuit is defective or not.

In the prior art, the semiconductor integrated circuit such as ECU for automobile has been subjected to screening to pick out early failure beforehand after a chip has been assembled into a package. However, in recent years, trials such as a bare ECU has been made wherein the semiconductor integrated circuit is mounted in a bare chip state to reduce a size of the substrate and to miniaturize the ECU, etc.

As described above, a technology that the burn-in voltage is supplied to conduct screening after the semiconductor integrated circuit is mounted on the substrate has been disclosed in Japanese Patent Application Publication (KOKAI) 7-287603. In this prior art, in the screening operation, the power supply voltage output of the stabilized power supply circuit in the ECU mounted on the substrate is switched to the higher voltage than the normal voltage according to the signal which is supplied from the external stabilized power supply voltage switching signal generator.

However, in the above prior art, since the power supply voltage output of the stabilized power supply circuit mounted on the substrate is switched to the higher voltage than the normal voltage according to the signal supplied from the external stabilized power supply voltage switching signal generator in the burn-in operation, a connector terminal which is not used in actual operations must be provided to the ECU connector for automobile to thus render the burn-in apparatus expensive. In addition, there has been no disclosure of the circuit configuration of the stabilized power supply circuit which switches the power supply output into the specified burn-in voltage being higher than the normal power supply voltage in the burn-in operation. Therefore, it is not apparent what circuit switching would be executed to generate a specified burn-in voltage and how the screening operation of the semiconductor integrated circuit which is mounted on the substrate as the bare chip would be executed by making use of such specified burn-in voltage.

SUMMARY OF THE INVENTION

The present invention has been made in view of the above circumstances, and an object of the present invention is to provide a burn-in apparatus capable of carrying out firmly burn-in of a semiconductor integrated circuit including a control circuit in an on-board condition without increasing its cost and also capable of providing a voltage regulator as a constituent element, which can output a burn-in voltage stably with good precision by simple circuit configuration.

In order to achieve the above objects, according to an aspect of the present invention, there is provided a burn-in apparatus comprising: a semiconductor integrated circuit including a control circuit in an on-board condition; an external communication circuit for transmitting a high voltage switching command and a normal voltage switching command via serial communication; the control circuit for outputting a switching signal when the high voltage switching command is input from the external communication circuit thereinto, and for terminating output of the switching signal when the normal voltage switching command is input from the external communication circuit thereinto; and a voltage regulator for supplying a normal power supply voltage to the semiconductor integrated circuit in an on-board condition when the switching signal is not input from the control circuit thereinto, and for supplying a high power supply voltage which is higher than the normal power supply voltage to the semiconductor integrated circuit when the switching signal is input from the control circuit thereinto.

With this configuration, in the screening operation, the switching signal is transmitted from the control circuit included in the on-board semiconductor integrated circuit to the voltage regulator, then the power supply voltage to be supplied to the semiconductor integrated circuit is switched to the predetermined voltage higher than the normal voltage, and then the screening is effected for the on-board semiconductor integrated circuit. Further, the high voltage switching command and the normal voltage switching command are input via the external communication circuit in terms of serial communication. Therefore, the connector terminal which is not used in the actual operation is not required and thus screening of the semiconductor integrated circuit can be conducted surely under the on-board condition without increasing its cost.

In the preferred embodiment of the present invention, the voltage regulator includes, a reference voltage source for outputting a reference voltage, and a voltage generating circuit for generating the normal power supply voltage from the reference voltage when the switching signal is not input thereinto, and for generating the high power supply voltage which is higher than the normal power supply voltage from the reference voltage when the switching signal is input thereinto.

In the preferred embodiment of the present invention, the voltage generating circuit includes, a voltage dividing circuit for dividing an output power supply voltage at a first voltage dividing ratio to output when the switching signal is not input thereinto, and for dividing the output power supply voltage at a second voltage dividing ratio to output when the switching signal is input thereinto, a feedback amplifier having first and second input terminals, the reference voltage being input into the first input terminal and an output voltage of the voltage dividing circuit being input into the second input terminal, and a voltage controlling circuit for inputting an output signal of the feedback amplifier and adjusting the output power supply voltage so as to make the reference voltage and the output voltage of the voltage dividing circuit equal in amplitude.

In the preferred embodiment of the present invention, the burn-in apparatus further comprising a voltage monitoring circuit for detecting switching of the power supply voltage which is supplied from the voltage regulator to the high power supply voltage which is higher than the normal power supply voltage, and for outputting a detected result to the control circuit. With this configuration, the control circuit per se can confirm that the power supply voltage has been switched to the high power supply voltage rather than the normal power supply voltage.

In the preferred embodiment of the present invention, the voltage regulator includes, a reference voltage source for outputting a first reference voltage when the switching signal is not input thereinto, and for outputting a second reference voltage when the switching signal is input thereinto, and a voltage generating circuit for generating the normal power supply voltage from the first reference voltage and for generating the high power supply voltage which is higher than the normal power supply voltage from the second reference voltage.

In the preferred embodiment of the present invention, the voltage generating circuit includes, a voltage dividing circuit for dividing an output power supply voltage at a predetermined voltage dividing ratio to output, a feedback amplifier having first and second input terminals, the first reference voltage or the second reference voltage being input into the first input terminal and an output voltage of the voltage dividing circuit being input into the second input terminal, and a voltage controlling circuit for inputting an output signal of the feedback amplifier and adjusting the output power supply voltage so as to make the first reference voltage or the second reference voltage and the output voltage of the voltage dividing circuit equal in amplitude.

In the preferred embodiment of the present invention, the burn-in apparatus further comprising: a reference pulse generator for generating a reference pulse; and an error detecting circuit for detecting difference between the reference pulse and a monitor pulse as an error; and wherein the voltage regulator includes a summing amplifier for adding the error to the output voltage of the voltage dividing circuit, and the control circuit outputs the monitor pulse.

With this configuration, the predetermined high voltage which is output from the voltage regulator in the screening operation and which is higher than the normal voltage can be controlled to coincide with the target screening voltage. Therefore, the specified screening voltage can be obtained with better precision.

In the preferred embodiment of the present invention, the control circuit outputs the switching signal and simultaneously outputs a control signal, and the error detecting circuit outputs the error when the control signal is input thereinto.

The nature, principle and utility of the invention will become more apparent from the following detailed description when read in conjunction with the accompanying drawings.

BRIEF DESCRIPTION OF THE DRAWINGS

In the accompanying drawings:

FIG. 5 is a circuit diagram showing a circuit configuration of a voltage regulator, etc. according to a second embodiment of the present invention;

DESCRIPTION OF THE PREFERRED EMBODIMENTS

Figure 1:
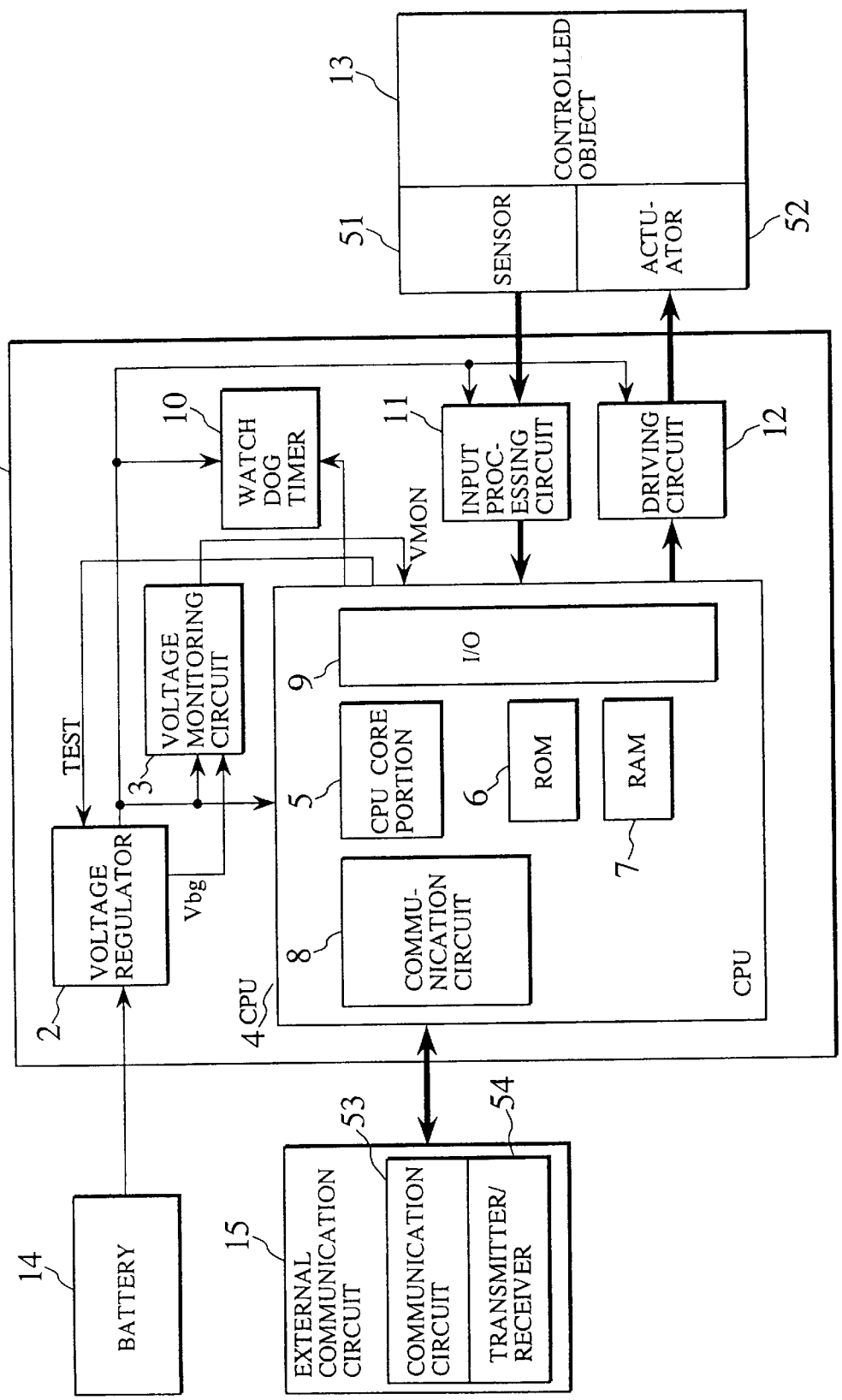
FIG. 1 is a block diagram showing a burn-in apparatus according to a first embodiment of the present invention.

Embodiments of the present invention will be explained with reference to accompanying drawings hereinafter. The embodiments of the present invention will be explained as being applied to the ECU for automobile, but they may of course be applied to other applications.

FIGS. 1 to 4 are views showing a burn-in apparatus according to a first embodiment of the present invention. First, an overall configuration of the burn-in apparatus for use in the ECU for automobile will be explained with reference to FIG. 1. A reference numeral 1 is an ECU, and a reference numeral 13 is a controlled object which is to be controlled by the ECU 1. A sensor 51 is attached to the controlled object 13 to represent a driving condition, and a signal supplied from the sensor 51 is input into the ECU 1. The ECU 1 comprises an input processing circuit 11 for waveform-processing the signal supplied from the sensor 51, a CPU 4 as a control circuit for receiving the signal which is supplied from the sensor 51 and whose waveform is processed and for carrying out predetermined arithmetic operations in accordance with a control program, and a driving circuit 12 for receiving arithmetic results as a control signal and driving an actuator 52 which is attached to the controlled object 13. The CPU 4 consists of a CPU core portion 5 for carrying out arithmetic operations, a ROM 6 for storing programs, a RAM 7 for storing arithmetic results, an I/O 9 for receiving a signal supplied from the input processing circuit 11 and for outputting a control signal to the driving circuit 12, and a communication circuit 8 used for serial communication between this CPU 4 and the external communication circuit 15 as an external communication means. In recent years, the automobile has been equipped with a fault diagnosis network (see ISO9141) to render fault diagnosis easy. For this reason, the ECU for automobile has already performed a function to transmit/receive data to/from an external communication circuit 15.

Figure 4:
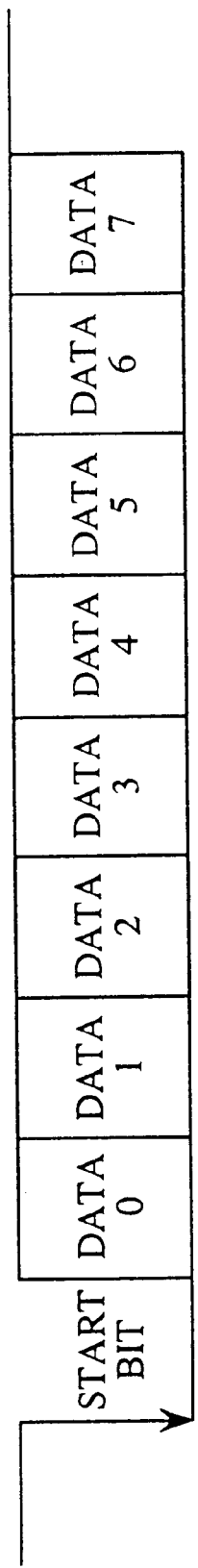
FIG. 4 is a view showing a communication format used in communication for an external communication circuit in the first embodiment of the present invention.

The external communication circuit 15 is made up of a hand-held computer or a personal computer, for instance. Usually the external communication circuit 15 is positioned on the outside of the automobile, and is connected to the ECU 1 on an as-needed basis, e.g., during diagnostic operation. In addition, a one-chip microcomputer is mounted on the external communication circuit 15 like the CPU 4. Particularly the external communication circuit 15 consists of a communication circuit 53 having a built-in CPU, a transmitter/receiver 54 for transmitting/receiving communication signals to/from a communication line, etc. The communication circuit 53 has the same configuration as the communication circuit 8 in the CPU 4. With the use of a communication format shown in FIG. 4, bi-directional communication can be established between the CPU 4 and the external communication circuit 15. The format shown in FIG. 4 is a format for serial communication interface (SCI) by which 8 bit data following a starting 1 bit are transmitted and received. This format has been used as a standard format in CPUs which are commercially available at present. Necessary commands are represented by hexadecimal number in this format, and various commands are transmitted from the external communication circuit 15 to the ECU 1 via this format.

A voltage regulator 2 receives a battery voltage from a battery 14 and then supplies requisite voltages to the semiconductor integrated circuit, i.e., the CPU 4, other custom ICs, general ICs, etc. The voltage regulator 2 has also a function to switch an output voltage, i.e., power supply voltage, into a burn-in voltage which is higher a normal voltage upon screening when a switching signal TEST is input from the CPU 4 to the voltage regulator 2. A reference numeral 3 denotes a voltage monitoring circuit which may detect that the power supply voltage Vcc has been switched into the burn-in voltage. An output voltage of the voltage monitoring circuit 3 is input into the CPU 4. The CPU 4 can monitor switching of the power supply voltage Vcc. A reference voltage Vbg without temperature dependence is supplied from a reference voltage source 20 in the voltage regulator 2 to the voltage monitoring circuit 3. A reference numeral 10 denotes a watch dog timer which is an IC for always monitoring operations of the CPU 4.

The CPU 4 is mounted in a bare chip state. The voltage regulator 2, the voltage monitoring circuit 3, the watch dog timer 10, the input processing circuit 11 and the driving circuit 12 are mounted as one chip in a bare chip state.

Figure 2:
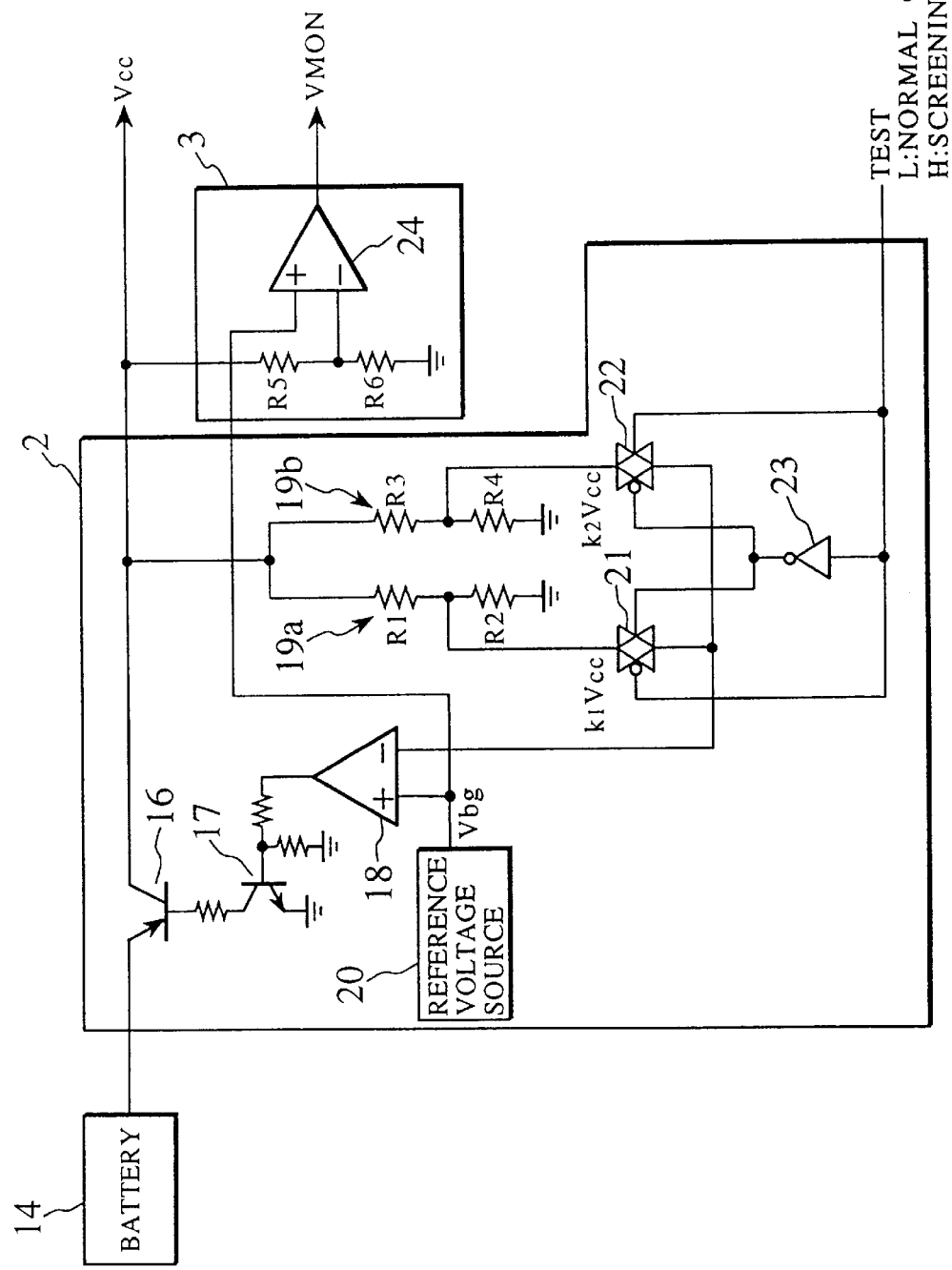
FIG. 2 is a circuit diagram showing a circuit configuration of a voltage regulator, etc. in the first embodiment of the present invention.

FIG. 2 shows detailed inner circuit configurations of the voltage regulator 2 and the voltage monitoring circuit 3. An output voltage of a battery 14 is input into an emitter terminal of a bipolar transistor 16. A voltage output from a collector terminal of the bipolar transistor 16 serves as a stabilized power supply voltage Vcc. The principle of this operation will be explained hereunder. The power supply voltage Vcc is voltage-divided into $k_1 \cdot Vcc$ and $k_2 \cdot Vcc$ by means of two kinds of detection resistances 19a (R1 and R2) and 19b (R3 and R4) which serving as a voltage dividing means respectively. The voltages $k_1 \cdot Vcc$ and $k_2 \cdot Vcc$ are input into an inverting input terminal (−) of a feedback amplifier 18 via analogue switches 21 and 22 respectively. A reference numeral 23 denotes an inverter. Where $k_1$ denotes a resistance ratio of voltage dividing resistances R1, R2, i.e., a voltage dividing ratio of the detection resistance 19a while $k_2$ denotes a resistance ratio of voltage dividing resistances R3, R4, i.e., a voltage dividing ratio of the detection resistance 19b. A reference voltage Vbg is input into a non-inverting input terminal (+) of the feedback amplifier 18 from a reference voltage source 20. A bandgap reference voltage circuit which can output a constant voltage irrespective of temperature change is used as the reference voltage source 20. The feedback amplifier 18 then amplifies a difference between the reference voltage Vbg and the voltage $k_1 \cdot Vcc$ or $k_2 \cdot Vcc$. An amplified output of the feedback amplifier 18 then controls a base current of a control transistor 16 via a transistor 17 to make the reference voltage Vbg and the voltage $k_1 \cdot Vcc$ or $k_2 \cdot Vcc$ equal. As a result, the power supply voltage Vcc can be stabilized at a value of $Vbg \cdot (1/k_1)$ or $Vbg \cdot (1/k_2)$ regardless of temperature change.

The switching signal TEST supplied from the CPU 4 is usually at L level, but is at H level in screening operation. In other words, usually the analogue switch 21 is selected, but the analogue switch 22 is selected in screening operation so that the power supply voltage Vcc becomes the burn-in voltage which is higher than the normal voltage. Voltage dividing ratios $k_1$, $k_2$ are set in advance to be $k_1 > k_2$.

Figure 6A:
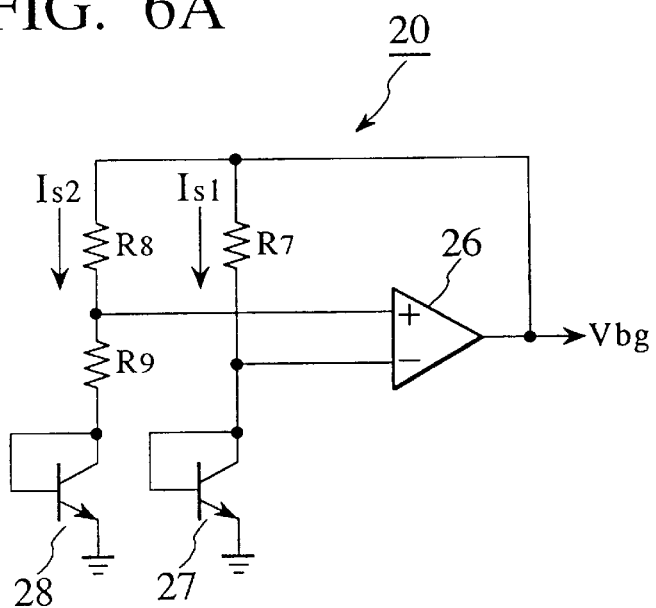
FIGS. 6A and 6B are circuit diagrams showing respectively circuit configurations of reference voltage sources in the first and second embodiments of the present invention.

A circuit configuration of the reference voltage source 20 in FIG. 2 is shown in FIG. 6A. The bandgap reference voltage circuit is employed as the reference voltage source 20, which consists of an operational amplifier 26, three resistances R7 to R9, and two collector-base connected transistors 27, 28. An output voltage Vbg of the bandgap reference voltage circuit will be expressed as follows.

$$Vbg = V_{BE1} + (R8/R9) \cdot V_T \cdot \ln(R8 \cdot I_{S2} / R7 \cdot I_{S1}) \qquad (1)$$

$$= V_{BE1} + K \cdot V_T$$

Therefore, K is acquired as follows.

$$K = (R8/R9) \cdot \ln(R8 \cdot I_{S2}/R7 \cdot I_{S1})$$

Where $V_{BE1}$ is a base-emitter voltage of a transistor, and a thermal voltage $V_T$ can be expressed as $V_T = kT/q$. Where k is a Boltzmann constant, q is charge of electron, and T is an absolute temperature.

A value of K can be determined depending upon respective ratios of (R8/R7), (R8/R9) and $(I_{S2}/I_{S1})$. $V_{BE1}$ has a negative temperature coefficient of −2 mV/° C. and $V_T$ has a positive temperature coefficient of +0.085 mV/° C. Accordingly, a temperature characteristic of the output Vbg can be made flat by adjusting a constant K which is decided according to circuit constants. At this time, the output voltage Vbg of the bandgap reference voltage circuit is about 1.26 V, as shown by a characteristic line a in FIG. 7.

Returning to FIG. 2, the voltage monitoring circuit 3 is made up of voltage resistances R5, R6 for monitoring the power supply voltage Vcc, and a comparator 24. In the comparator 24, the Vcc monitor voltage which is voltage-divided by the voltage-dividing resistors R5, R6 is input into its inverting input terminal (−) and the reference voltage Vbg supplied from the reference voltage source 20 is input into its non-inverting input terminal (+). The values of the voltage-dividing resistors R5, R6 are designed such that, when the power supply voltage Vcc is shifted to the burn-in voltage which is higher than the normal voltage, an output of the comparator 24 is inverted in level.

Figure 3:
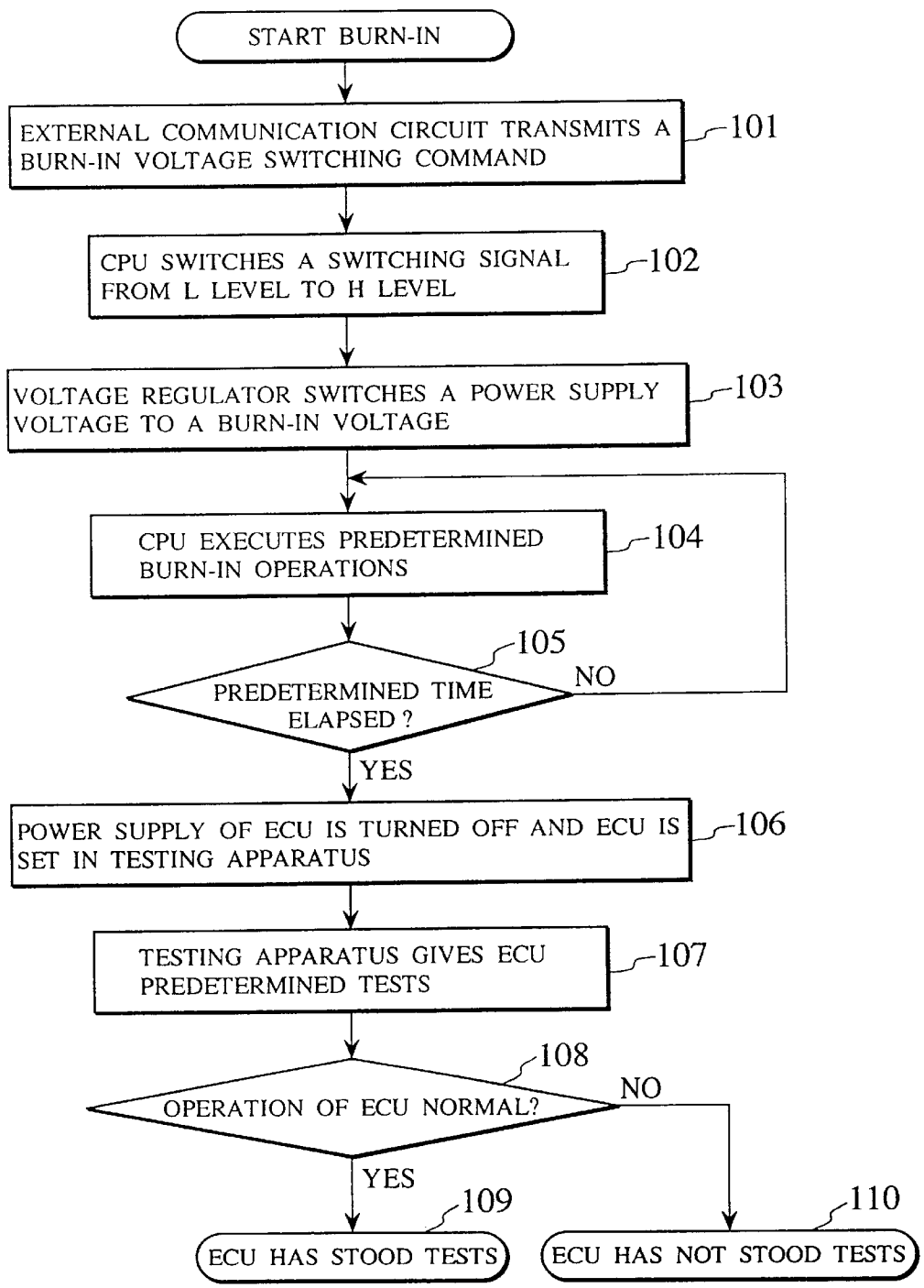
FIG. 3 is a flowchart illustrating operations of the burn-in apparatus according to the first embodiment of the present invention.

Next, a power supply voltage switching operation will be explained with reference to a flowchart in FIG. 3 hereunder. At first, the external communication circuit 15 transmits a burn-in voltage switching command to the CPU 4 via serial communication (step 101). The CPU 4 changes a level of the switching signal TEST from L level to H level in response to this command (step 102). If the voltage regulator 2 receives the switching signal TEST at H level, it switches the power supply voltage Vcc into the burn-in voltage which is higher than the normal voltage, by changing the resistance ratio of the detection resistances from $k_1$ to $k_2$ (step 103). According to a power supply voltage monitor VMON supplied from the voltage monitoring circuit 3, the CPU 4 executes confirmation that the power supply voltage Vcc has been switched to the burn-in voltage. The CPU 4 then executes predetermined burn-in operations (step 104). It is then determined whether or not a predetermined time has elapsed (step 105). If NO, the CPU 4 still continues the burn-in operations. If YES, i.e., after the burn-in operations carried out for the predetermined time are terminated, the power supply of the ECU 1 is turned off and thereafter the ECU 1 is set in a testing apparatus (step 106). The testing apparatus gives the ECU 1 a predetermined test (step 107). According to the result of the test, the testing apparatus decides whether or not the operation of the ECU 1 can operate normally after the burn-in voltage has been applied to the ECU 1 (step 108). If the normal operation of the ECU 1 has been confirmed, it is judged that the ECU 1 has been able to stand the test (step 109). Unless the normal operation of the ECU 1 has been confirmed, it is judged that the ECU 1 has not been able to stand the test (step 110).

As described above, according to the first embodiment, burn-in of the semiconductor integrated circuit can be implemented in an on-board condition. Concretely, the burn-in voltage generating circuit is provided in the ECU, the burn-in command is input into the ECU via the external communication circuit, and the power supply voltage is automatically switched from the normal voltage to the burn-in voltage based on the command. The burn-in voltage generating circuit is formed by a very simple circuit.

Figure 6B:
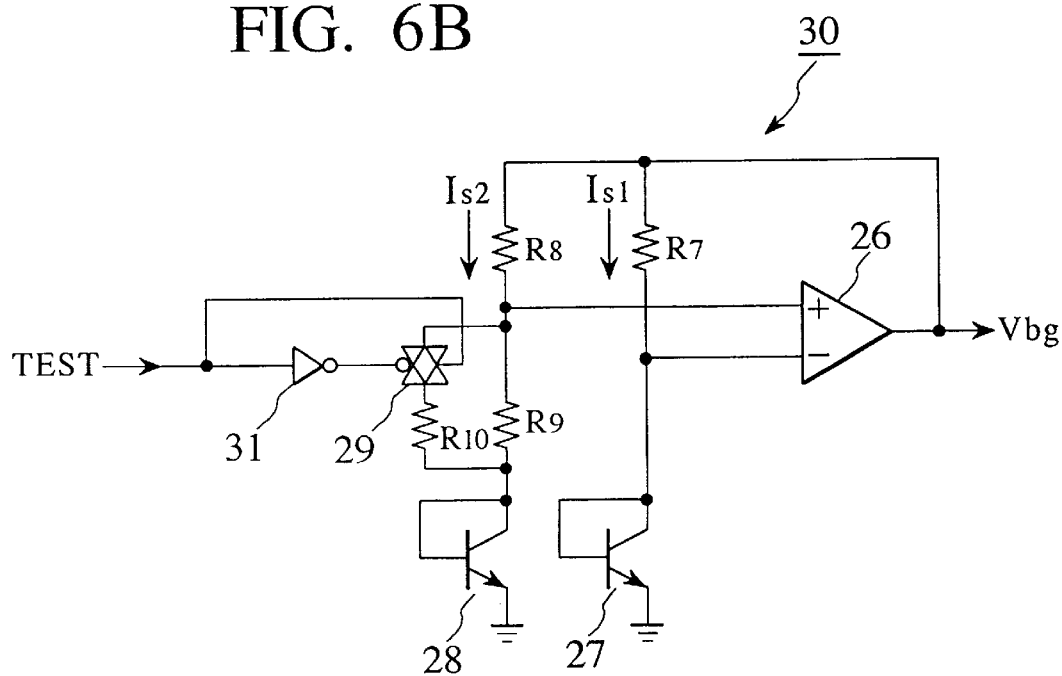
Figure 7:
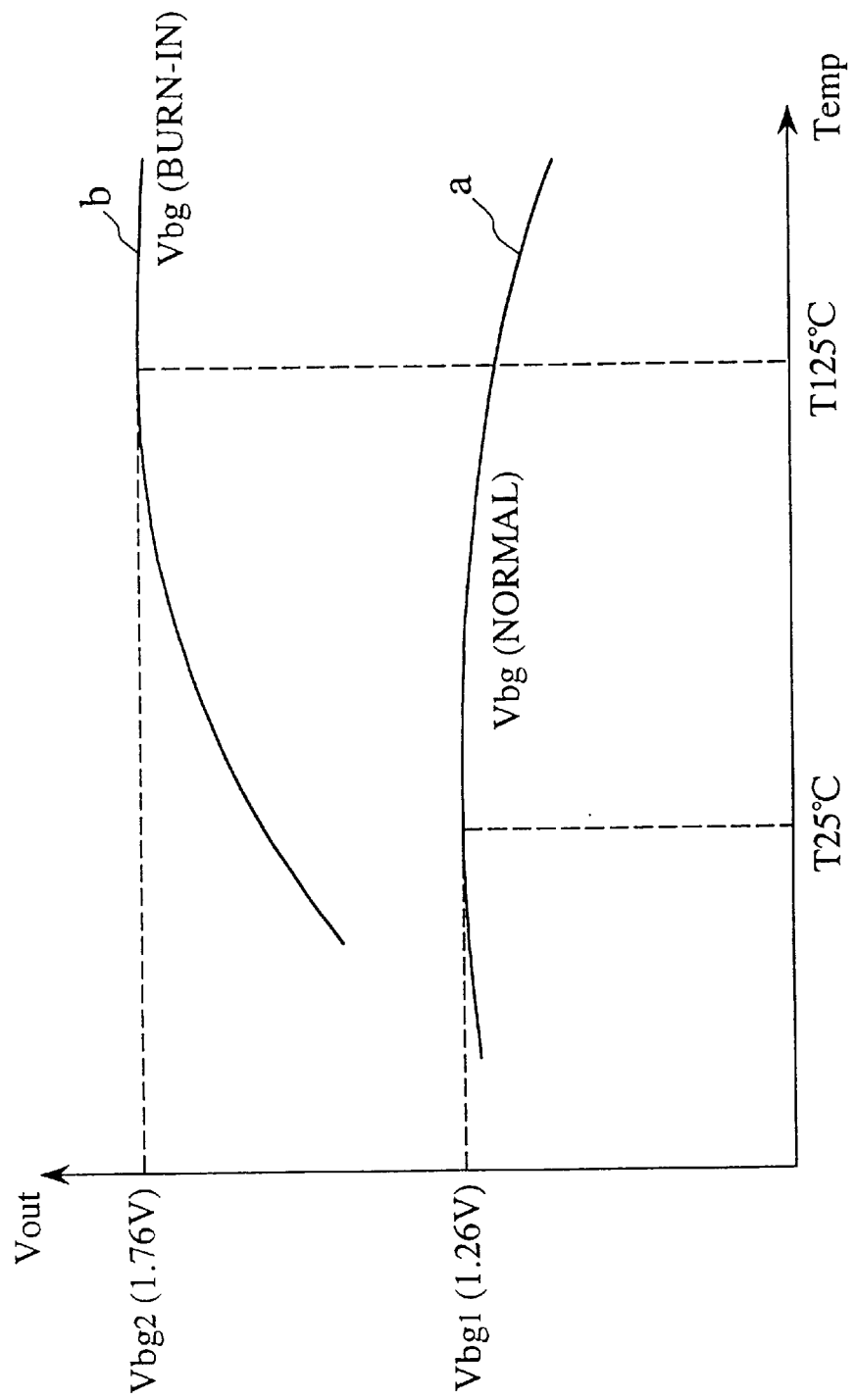
FIG. 7 is a view showing temperature characteristics of output reference voltage output from the reference voltage sources.

FIGS. 5 to 7 shows a second embodiment of the present invention. In the second embodiment, a configuration of the voltage regulator is modified partially in contrast to the first embodiment. FIG. 5 shows an inner circuit configuration of the voltage regulator 25. This voltage regulator 25 is different from the voltage regulator in FIG. 2 in that only a resistance for the normal power supply voltage is provided as a detection resistance 19 for the power supply voltage Vcc and that the burn-in voltage which is higher than the normal voltage can be obtained by switching the reference voltage Vbg output from a reference voltage source 30 according to the switching signal TEST supplied from the CPU 4.

In the meanwhile, usually the burn-in test is effected in screening. The burn-in test means a breakdown voltage test of a device constituting the semiconductor integrated circuit. This test is carried out by supplying a certain voltage (usually 7 V in the case of CMOS) to the semiconductor integrated circuit for several hours in a high temperature environment such as 125° C. Therefore, the circuit which is to generate a high voltage in screening may be caused to operate only at the time of high temperature. It would thus be evident that, unlike the output voltage of the voltage regulator in normal operation, the output voltage of the voltage regulator used in screening operation does not have to be kept constant over a certain temperature range.

Consequently, the reference voltage source 30 which is made up of the bandgap reference voltage circuit having a particular circuit configuration is employed in the voltage regulator 25 of the second embodiment. That is, the bandgap reference voltage circuit is composed such that a regulator output voltage can be set to coincide with a predetermined burn-in voltage at an ambient temperature of 125° C. by inclining its temperature characteristic intentionally. If the resistance ratio k of the detection resistance 19 is assumed not to be switched, the reference voltage Vbg must be set to 1.76 V so as to output 7 V to the power supply voltage Vcc because Vcc=Vbg/k. Therefore, as shown by a characteristic line b in FIG. 7, a value of the circuit constant $K_b$ of the bandgap reference voltage circuit may be so determined to output the burn-in voltage that the reference voltage Vbg (125° C.) becomes 1.76 V at the temperature of 125° C. The value of the circuit constant $K_b$ becomes large rather than the circuit constant K to output the normal power supply voltage, nevertheless the value of the circuit constant $K_b$ can be made larger than the value of the circuit constant K if a resistance value of the resistance R9 is set small according to Eq. (1). In order to achieve this condition, the reference voltage source 30 of the second embodiment is constituted as shown in FIG. 6B. In other words, an analogue switch 29 and a resistance R10, both being connected serially, are connected in parallel with the resistance R9 which is connected to a transistor 28. A reference numeral 31 is an inverter. When the switching signal TEST supplied from the CPU 4 is at L level, the analogue switch 29 is in an off state to thus output a reference voltage Vbg1 (1.26 V) for the normal power supply voltage Vcc. When the switching signal TEST is turned to H level, i.e., in the screening operation, the analogue switch 29 is turned on to thus connect the resistance R10 in parallel with the resistance R9. As a result, a change in the temperature characteristic of the reference voltage Vbg is caused to output a set reference voltage Vbg2 (1.76 V). Accordingly, an output voltage of the voltage regulator 25 can provide a predetermined burn-in voltage at the screening temperature.

According to the second embodiment, since the reference voltage Vbg output from the reference voltage source 30 can be switched according to the switching signal TEST supplied from the CPU 4, only a set of the detection resistances 19 can provide the power supply voltage Vcc in the voltage regulator 25. Therefore, according to the second embodiment, such an advantage can be achieved that a circuit scale can be made small rather than the first embodiment.

Figure 8:
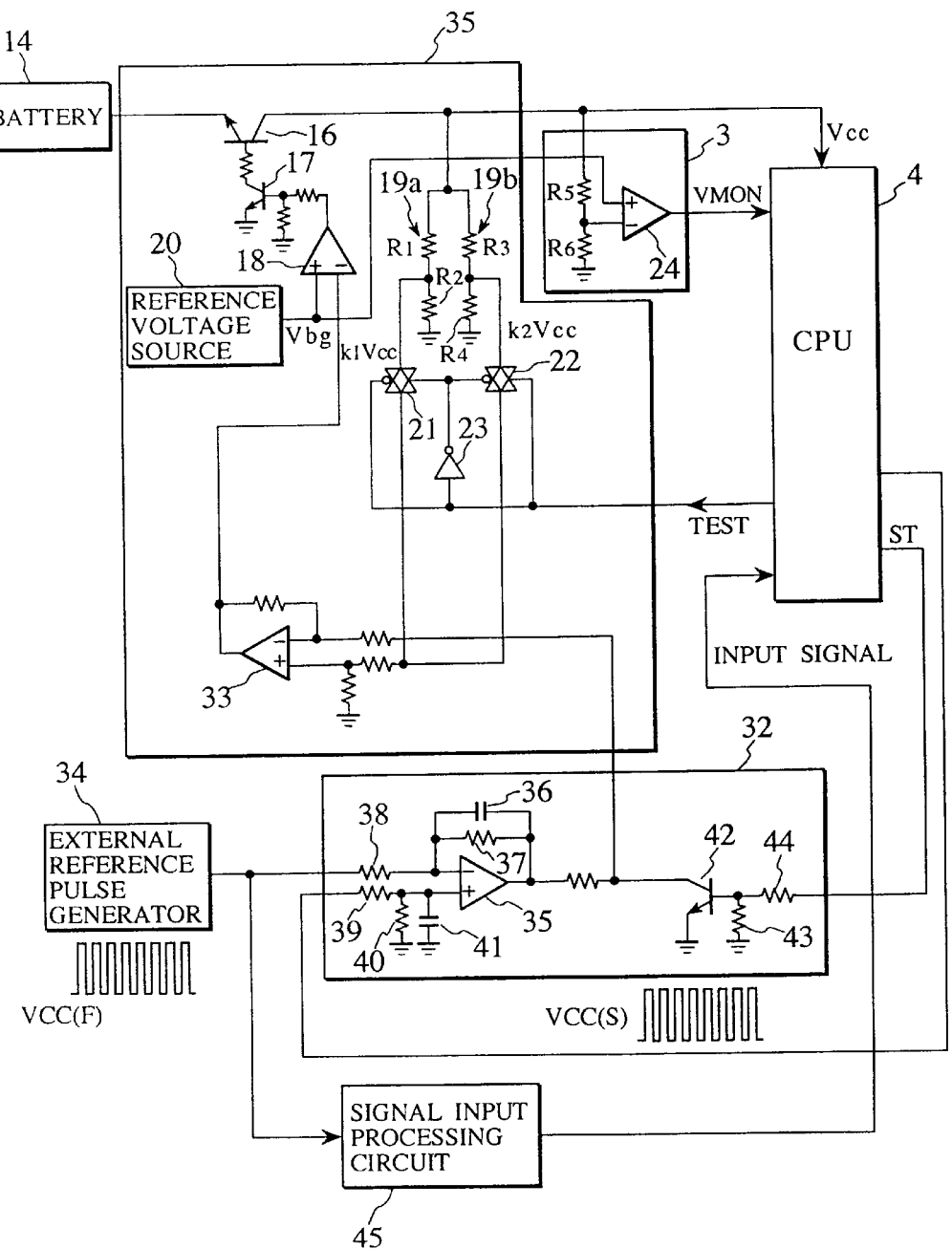
FIG. 8 is a circuit diagram showing a burn-in apparatus according to a third embodiment of the present invention.

A third embodiment of the present invention is shown in FIG. 8. In the third embodiment, an accuracy of the burn-in voltage output from the voltage regulator in the screening operation can be enhanced. In the voltage regulator 2 of the first embodiment shown in FIG. 2, due to various factors such as voltage offset of the feedback amplifier 18, an accuracy of the specific resistance of the detection resistances 19a, 19b, variation in the reference voltage Vbg from the reference power supply 20, etc., several % of error may be caused in the burn-in voltage during the screening operation. In the event that the output voltage in the screening operation is made lower than the predetermined burn-in voltage value because of such error, it may be considered that voltage acceleration is not conducted sufficiently and that an advantage of picking up early failures previously by virtue of burn-in screening is reduced. The third embodiment is designed to improve these disadvantages. In other words, since the power supply voltage in the screening operation is monitored as a peak value of a rectangular pulse and then a difference between a peak value of the reference pulse and the peak value of the rectangular pulse is fed back to the voltage regulator, the normal burn-in voltage value can be achieved with good precision.

An average voltage of the output pulse of the CPU is in proportion to the power supply voltage applied to the CPU. That is, a voltage which is derived by multiplying a duty ratio of the output pulse of the CPU by the power supply voltage is the average voltage. Thus, the output pulse of the CPU can be used to monitor the power supply voltage. In addition, the external reference pulse can also be extracted from the average voltage of the reference pulse. For this reason, if an error signal which can be obtained by comparing two voltages with each other is fed back to the voltage control terminal of the power supply circuit, two voltages coincide with each other based on the principle of the feedback amplifier. Namely, the power supply voltage applied to the semiconductor integrated circuit such as ECU would coincide with the reference voltage. This is the principle of the voltage regulator according to the third embodiment.

Differences between the circuit configuration in FIG. 8 and those in FIGS. 1 and 2 will be explained hereunder. In the third embodiment, an error detecting circuit 32 and a signal input processing circuit 45 are added to the configuration of the ECU in FIG. 1, and a summing amplifier 33 is also added to the configuration of the voltage regulator in FIG. 2. A reference numeral 34 is an external reference pulse generator. The error detecting circuit 32 is made up of a differential amplifier 35, resistances 37 to 40, capacitors 36, 41, a transistor 42, and resistors 43, 44. The differential amplifier 35 serves as an error amplifier, and the resistances 37 to 40 and the capacitors 36, 41 serve as a low-pass filter. The transistor 42 and the resistors 43, 44 constitute a start-up circuit.

When the CPU 4 changes the switching signal TEST from L level to H level to thus switch the power supply voltage Vcc of the voltage regulator 35 to the burn-in voltage, the CPU 4 outputs a monitor pulse Vcc(S) having a preset duty ratio at a preset time period. The peak value of the monitor pulse Vcc(S) is equal to the on-board burn-in voltage applied to the CPU 4 which is subjected to screening. The monitor pulse Vcc(S) is converted into a DC monitor voltage by the low-pass filter. Further, a reference pulse Vcc (F) which has the same interval and the same duty ratio as those of the monitor pulse and has the same peak value as that of a target burn-in voltage is output from the external reference pulse generator 34. The reference pulse Vcc(F) is also converted into a DC reference voltage by the low-pass filter. A difference between the monitor pulse Vcc(S) and the reference pulse Vcc(F) is amplified by the differential amplifier 35 to provide an error signal. This error signal is added to a voltage generated across the detection resistance 19b by the summing amplifier 33 of the voltage regulator 35 and then a resultant signal is transmitted to the feedback amplifier 18. The feedback amplifier 18 adjusts a base current of the control transistor 16 so as to control a output voltage of the voltage regulator to an optimum value. As a result, the burn-in voltage which is an output of the voltage regulator 35 can be controlled so as to coincide with a reference burn-in voltage as a target value.

In the normal operation, the CPU 4 does not output the monitor pulse and also renders the transistor 42 of the start-up circuit to turn on, whereby turning off feedback of the burn-in voltage detecting circuit 32. In the screening operation, the CPU 4 executes switching control of the power supply voltage Vcc and then starts to output the monitor pulse Vcc(S). Subsequently, after the monitor pulse Vcc(S) and the reference pulse Vcc(F) are stabilized, the CPU 4 turns off the transistor 42 of the start-up circuit. The connector terminal of the external reference pulse generator 34 is the reference pulse signal input terminal which is used to fine control the burn-in voltage in the screening operation, but usually the connector terminal may be used as the signal input terminal. Usually the signal input processing circuit 45 implements waveform processing of the external input signal.

Incidentally, the third embodiment may be applied to the voltage regulator in the second embodiment (FIG. 5).

With the above configuration, such advantages can be achieved that the burn-in voltage can be derived with good precision in an on-board condition and screening of the semiconductor integrated circuit can be carried out under the predetermined errorless burn-in voltage condition. If all parts necessary for the third embodiment are installed in the semiconductor integrated circuit, an apparatus having the above advantages can be realized without increasing its cost and the parts mounting area.

In the above embodiments, although the ECU in which the microcomputer is mounted has been explained by way of illustration, the function for switching the normal power supply voltage into the screening power supply voltage when the communication signal is supplied may be constituted as a logical circuit. Further, the logical circuit together with the power supply circuit can be provided as a custom IC. These do not depart from the scope of the present invention.

It should be understood that many modifications and adaptations of the invention will become apparent to those skilled in the art and it is intended to encompass such obvious modifications and changes in the scope of the claims appended hereto.

What is claimed is:

1. A burn-in apparatus comprising:
   a semiconductor integrated circuit including a control circuit in an on-board condition;
   an external communication circuit for transmitting a high voltage switching command and a normal voltage switching command via serial communication;
   said control circuit for outputting a switching signal when said high voltage switching command is input from said external communication circuit thereinto, and for terminating output of said switching signal when said normal voltage switching command is input from said external communication circuit thereinto; and
   a voltage regulator for supplying a normal power supply voltage to said semiconductor integrated circuit in an on-board condition when said switching signal is not input from said control circuit thereinto, and for supplying a high power supply voltage which is higher than said normal power supply voltage to said semiconductor integrated circuit when said switching signal is input from said control circuit thereinto.

2. A burn-in apparatus according to claim 1, wherein said voltage regulator includes:
   a reference voltage source for outputting a reference voltage, and
   a voltage generating circuit for generating said normal power supply voltage from said reference voltage when said switching signal is not input thereinto, and for generating said high power supply voltage which is higher than said normal power supply voltage from said reference voltage when said switching signal is input thereinto.

3. A burn-in apparatus according to claim 2, wherein said voltage generating circuit includes:
   a voltage dividing circuit for dividing an output power supply voltage at a first voltage dividing ratio to output when said switching signal is not input thereinto, and for dividing said output power supply voltage at a second voltage dividing ratio to output when said switching signal is input thereinto,
   a feedback amplifier having first and second input terminals, said reference voltage being input into said first input terminal and an output voltage of said voltage dividing circuit being input into said second input terminal, and
   a voltage controlling circuit for inputting an output signal of said feedback amplifier and adjusting said output power supply voltage so as to make said reference voltage and said output voltage of said voltage dividing circuit equal in amplitude.

4. A burn-in apparatus according to claim 3, further comprising:
   a reference pulse generator for generating a reference pulse; and
   an error detecting circuit for detecting difference between said reference pulse and a monitor pulse as an error; and
   wherein said voltage regulator includes a summing amplifier for adding said error to said output voltage of said voltage dividing circuit, and said control circuit outputs said monitor pulse.

5. A burn-in apparatus according to claim 4, wherein said control circuit outputs said switching signal and simultaneously outputs a control signal, and said error detecting circuit outputs said error when said control signal is input thereinto.

6. A burn-in apparatus according to claim 1, further comprising a voltage monitoring circuit for detecting switching of said power supply voltage which is supplied from said voltage regulator to said high power supply voltage which is higher than said normal power supply voltage, and for outputting a detected result to said control circuit.

7. A burn-in apparatus according to claim 1, wherein said voltage regulator includes:

a reference voltage source for outputting a first reference voltage when said switching signal is not input thereinto, and for outputting a second reference voltage when said switching signal is input thereinto, and a voltage generating circuit for generating said normal power supply voltage from said first reference voltage and for generating said high power supply voltage which is higher than said normal power supply voltage from said second reference voltage.

8. A burn-in apparatus according to claim 7, wherein said voltage generating circuit includes:

a voltage dividing circuit for dividing an output power supply voltage at a predetermined voltage dividing ratio to output, a feedback amplifier having first and second input terminals, said first reference voltage or said second reference voltage being input into said first input terminal and an output voltage of said voltage dividing circuit being input into said second input terminal, and a voltage controlling circuit for inputting an output signal of said feedback amplifier and adjusting said output power supply voltage so as to make said first reference voltage or said second reference voltage and said output voltage of said voltage dividing circuit equal in amplitude.

9. A burn-in apparatus according to claim 8, further comprising:

a reference pulse generator for generating a reference pulse; and an error detecting circuit for detecting difference between said reference pulse and a monitor pulse as an error; and wherein said voltage regulator includes a summing amplifier for adding said error to said output voltage of said voltage dividing circuit, and said control circuit outputs said monitor pulse.

10. A burn-in apparatus according to claim 9, wherein said control circuit outputs said switching signal and simultaneously outputs a control signal, and said error detecting circuit outputs said error when said control signal is input thereinto.

\* \* \* \* \*